(12) United States Patent
Seabrook

(10) Patent No.: US 7,780,314 B2
(45) Date of Patent: Aug. 24, 2010

(54) LIGHTING ASSEMBLY, HEAT SINK AND HEAT RECOVERY SYSTEM THEREFOR

(75) Inventor: Bill Seabrook, Toronto (CA)

(73) Assignee: 1662801 Ontario Inc., Toronto, Ontario (CA)

( * ) Notice: Subject to any disclaimer, the term of this patent is extended or adjusted under 35 U.S.C. 154(b) by 437 days.

(21) Appl. No.: 10/582,829

(22) PCT Filed: Dec. 16, 2004

(86) PCT No.: PCT/CA2004/002141

§ 371 (c)(1),
(2), (4) Date: May 2, 2007

(87) PCT Pub. No.: WO2005/059436

PCT Pub. Date: Jun. 30, 2005

(65) Prior Publication Data

US 2007/0285920 A1     Dec. 13, 2007

Related U.S. Application Data

(60) Provisional application No. 60/529,613, filed on Dec. 16, 2003.

(51) Int. Cl.
*F21V 29/00*     (2006.01)
(52) U.S. Cl. .................. 362/294; 362/373; 362/429
(58) Field of Classification Search .............. 362/294, 362/373, 372, 419, 428, 429; 257/720; 631/709
See application file for complete search history.

(56) References Cited

U.S. PATENT DOCUMENTS

| | | | |
|---|---|---|---|
| 5,763,951 A * | 6/1998 | Hamilton et al. | ............ 257/714 |
| 5,782,292 A | 7/1998 | Ogawara et al. | |
| 6,170,967 B1 * | 1/2001 | Usher et al. | ................. 362/394 |
| 6,220,722 B1 | 4/2001 | Begemann | |
| 6,274,924 B1 | 8/2001 | Carey et al. | |
| 6,481,871 B2 * | 11/2002 | Jamison | ..................... 362/287 |
| 6,481,874 B2 * | 11/2002 | Petroski | ..................... 362/373 |
| 6,547,423 B2 | 4/2003 | Marchall et al. | |
| 2003/0052584 A1 * | 3/2003 | Matsui et al. | ................. 313/24 |
| 2003/0214803 A1 * | 11/2003 | Ono et al. | ..................... 362/1 |

(Continued)

FOREIGN PATENT DOCUMENTS

JP     011-50379     6/1989

(Continued)

OTHER PUBLICATIONS

International Preliminart Report on Patentabilty in connection with PCT/CA2004/002141 of which this application is United States national stage, dated Dec. 16, 2004.

*Primary Examiner*—Jong-Suk (James) Lee
*Assistant Examiner*—Julie A Shallenberger
(74) *Attorney, Agent, or Firm*—Wood, Phillips, Katz, Clark & Mortimer

(57) ABSTRACT

A lighting assembly includes a thermally conductive mounting having a mounting surface is provided. A heat sink seat having a front and rear surface is moveably mounted to the mounting surface. A light emitting device may be attached to the front surface of the heat sink seat. Different embodiments of the lighting assembly, a heat sink and a heat recovery system for the light assembly are also provided.

28 Claims, 13 Drawing Sheets

U.S. PATENT DOCUMENTS

| | | | | |
|---|---|---|---|---|
| 2005/0030754 A1* | 2/2005 | Licht | .......................... | 362/433 |
| 2006/0034085 A1* | 2/2006 | Wang et al. | .................. | 362/294 |
| 2006/0133090 A1* | 6/2006 | Noh et al. | ................... | 362/294 |
| 2006/0203465 A1* | 9/2006 | Chang et al. | .................. | 362/29 |

FOREIGN PATENT DOCUMENTS

JP    2003-031005    1/2003

\* cited by examiner

LIGHTING ASSEMBLY, HEAT SINK AND HEAT RECOVERY SYSTEM THEREFOR

FIELD OF THE INVENTION

The present invention relates to lighting assemblies, and more particularly to lighting assemblies for light emitting diode (LED) arrays, a heat sink, and a heat recovery system therefor.

BACKGROUND OF THE INVENTION

Light emitting diodes (LEDs) are generally more energy efficient, more reliable and have longer lifetimes than other types of lighting. One performance measure of an LED is its photometric efficiency, e.g. the conversion of input energy into visible light. Photometric efficiency is inversely proportional to the junction temperature of an LED. Junction temperature also affects the operational lifetime of LEDs. Accordingly, keeping the LED junction temperature cool is an important consideration in the design of LED devices.

Traditionally, heat dissipation of LEDs was provided by the lead wires of the LED itself. However, this technique is inefficient and limits the efficiency of LED devices. Another method for controlling LED junction temperature uses a heat sink slug to draw heat away from the LED. An example of such an apparatus is described in U.S. Pat. No. 6,274,924 to Carey et al., issued Aug. 14, 2001. An LED die is attached to the heat sink slug using a thermally conductive material or submount. The heat sink slug is inserted into an insert-molded leadframe. The heat sink slug may include a reflector cup. Bond wires extend from the LED to metal leads on the leadframe. The metal leads are electrically and thermally isolated from the slug. An optical lens may be used to focus the light emitted from the LED. This apparatus is useful for dissipating heat from the LED, however it requires that the heat be dissipated to air. This problem becomes exacerbated with high wattage LEDs and multiple LED devices where heat generation is greater. A solution to the external heat dissipation is not provided by the apparatus of Carey et al.

Control and focus of the light emitted from an LED is typically provided using a collimator such as those described in U.S. Pat. No. 6,547,423 to Marshall et al., issued Apr. 15, 2003. A collimator uses a lens and refractive walls to focus the light emitted from an LED. An LED and collimator combination yields a high level of efficiency in terms of control of emitted light or luminous flux.

The aiming of individual light sources so that the object or area of interest is properly lit is an important consideration. A known method of aiming individual light sources is an arrangement commonly referred to as a gimble ring. Gimble rings are known in the art and are commonly used in track lighting. Gimble rings work well with incandescent lights and other light sources that do not depend on a thermal circuit at the back of the lighting assembly. However, gimble rings are not suitable for light sources that require a thermal circuit at the back because the ring arrangement lacks the required surface area. Further, gimble ring-type arrangements are not appropriate for use in small spaces, for example, where clearance around the light source is limited or where several light sources are to be used close together.

Thus, there remains a need for a lighting assembly for an LED that provides adequate heat dissipation for single LED applications, high wattage LEDs and multiple LED devices. There is also a need for a lighting assembly for LEDs and other light sources requiring a thermal circuit at the rear which provides for the aiming of individual light sources.

SUMMARY OF THE INVENTION

The present invention is a lighting assembly, heat sink, and heat recovery system therefor that may be used for mounting LEDs including higher wattage LEDs and multiple LED devices. Some embodiments of the present invention also provide a mechanism for the aiming of individual light sources that may be used in tight spaces and with light sources requiring a thermal circuit at the rear. Some embodiments also provide for linear LED arrays to be used.

In accordance with one aspect of the present invention, there is provided a lighting assembly, comprising: a mounting having a concave mounting surface and defining an indexing channel; a seat having a front and rear surface, the seat including an indexer at the rear surface thereof, the indexer being received in the indexing channel; and a light source attached to the front surface of the seat.

In accordance with another aspect of the present invention, there is provided a lighting assembly, comprising: a thermally conductive mounting having a mounting surface; and a heat sink seat having a front and rear surface, the heat sink seat being moveably mounted to the mounting surface, wherein the shape of the mounting surface corresponds to the shape of the rear surface of the heat sink seat, wherein the front surface of the heat sink seat is configured to receive a light emitting device.

In accordance with a further aspect of the present invention, there is provided a heat sink, comprising: a thermally conductive mounting having a mounting surface; and a heat sink seat having a front and rear surface, the heat sink seat being moveably mounted to the mounting surface.

In accordance with another aspect of the present invention, there is provided a heat recovery system, comprising: a lighting assembly including a thermally conductive mounting having a rear surface, and a heat exchanger tube provided on the rear surface of the mounting for carrying a heat exchange fluid, the heat exchanger tube having an inlet end for receiving the heat exchange fluid at a relatively low temperature and an outlet end for discharging the heat exchange fluid at a relatively high temperature.

In accordance with yet a further aspect of the present invention, there is provided a heat recovery system, comprising: a thermally conductive mounting having a rear surface and a mounting surface; a heat sink seat having a front and rear surface, the heat sink seat being moveably mounted to the mounting surface; a light emitting device mounted to the front surface of the heat sink seat; and a heat exchanger tube provided on the rear surface of the mounting for carrying a heat exchange fluid, the heat exchanger tube having an inlet end for receiving the heat exchange fluid at a relatively low temperature and an outlet end for discharging the heat exchange fluid at a relatively high temperature.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Reference will now be made to the accompanying drawings which show, by way of example, embodiments of the present invention, and in which.

Similar references are used in different figures to denote similar components.

DETAILED DESCRIPTION OF THE EMBODIMENTS

Figure 1:
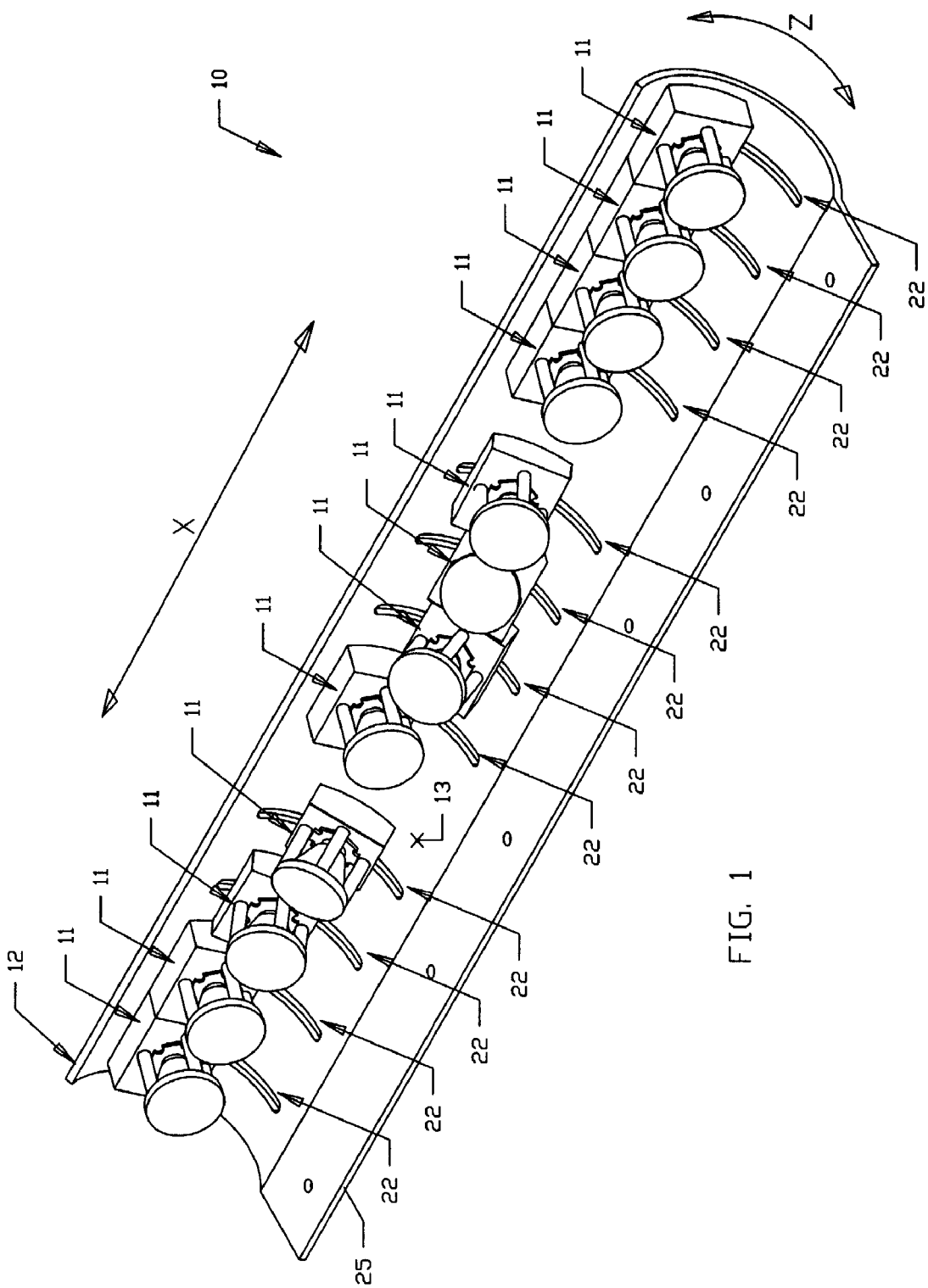
FIG. 1 is a perspective view of one embodiment of a lighting assembly according to the present invention.
Figure 2:
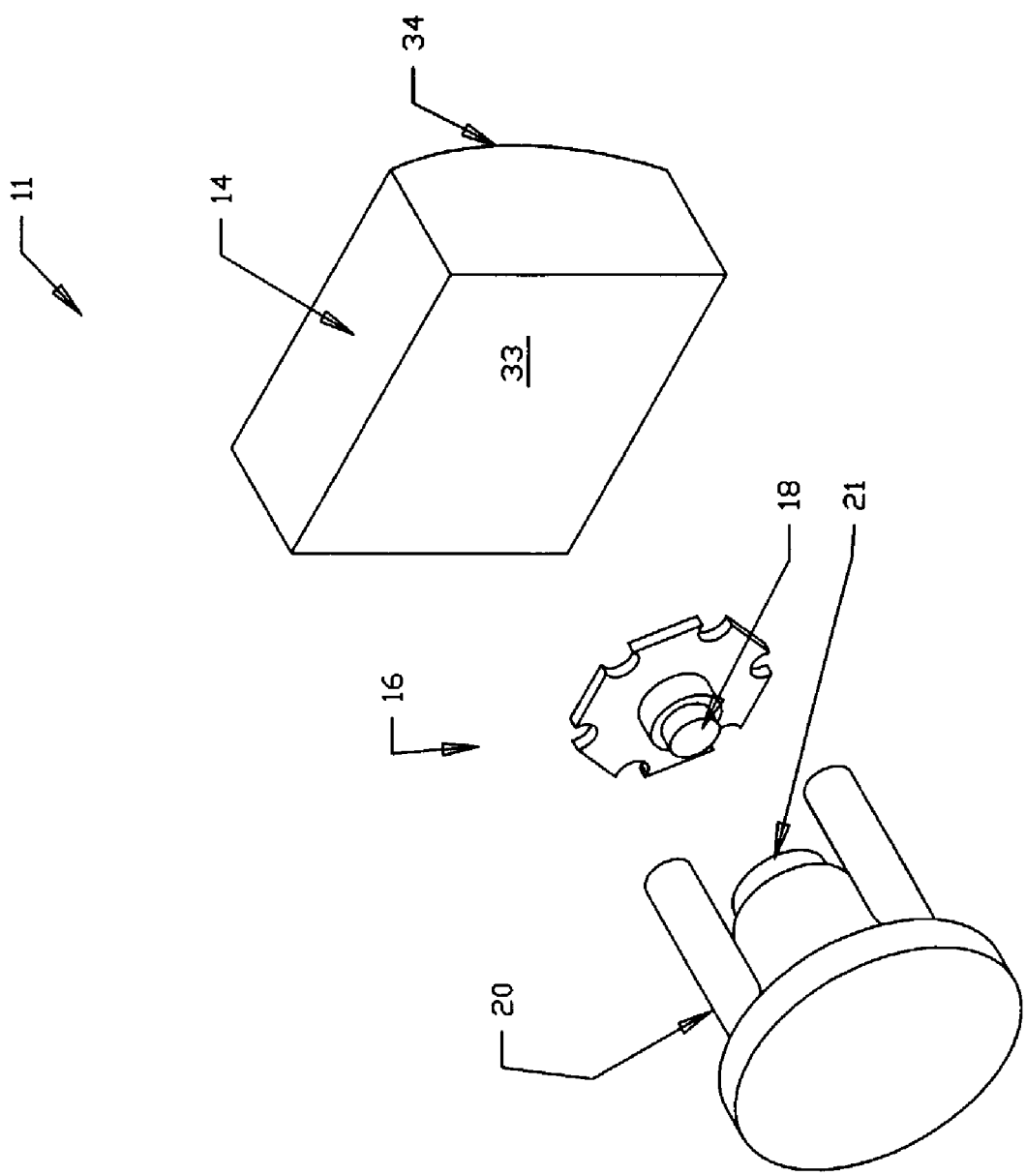
FIG. 2 is an exploded perspective view of an LED module of the lighting assembly of FIG. 1.
Figure 3:
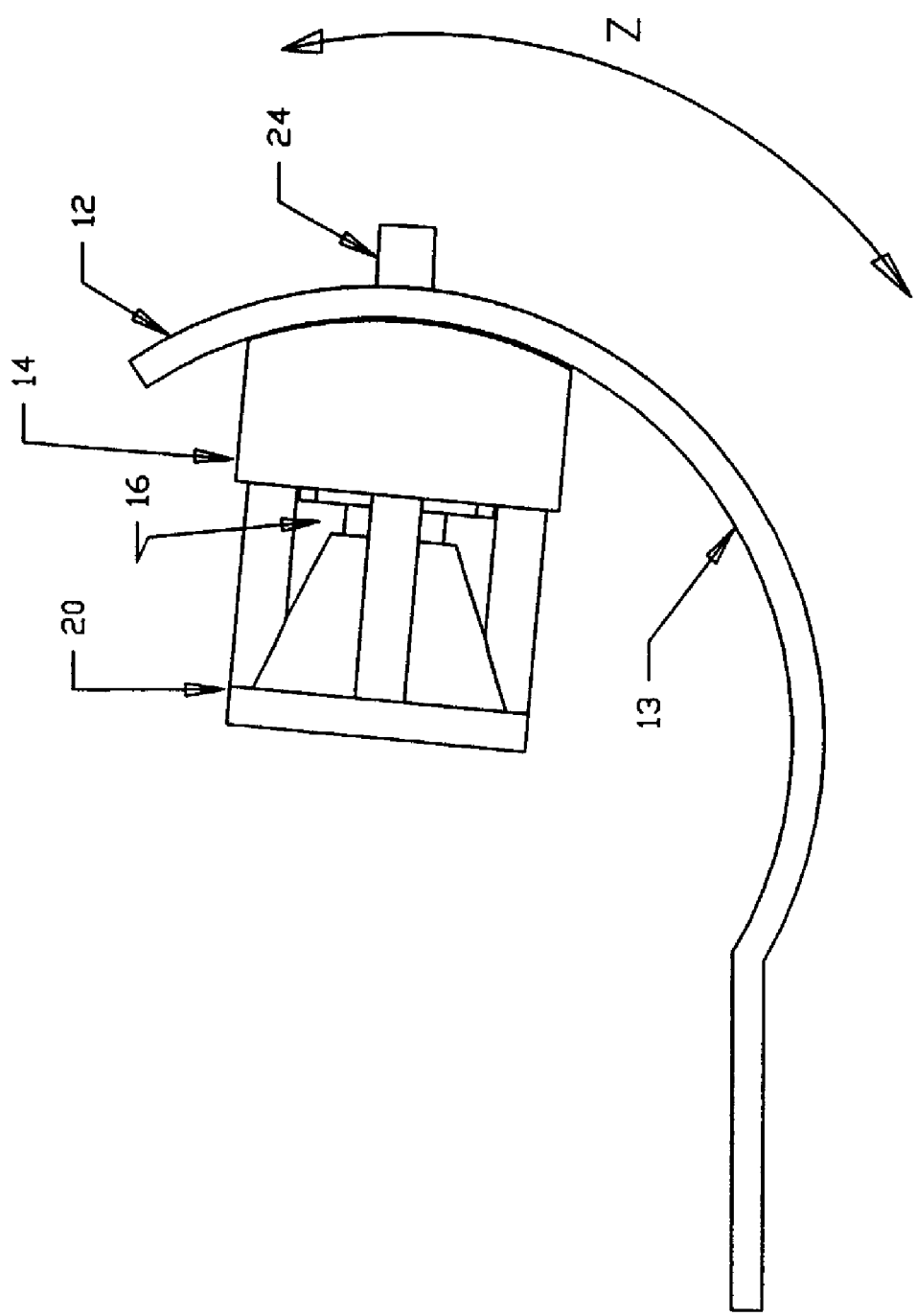
FIG. 3 is a side view of the lighting assembly of FIG. 1.

Referring to FIG. 1 to 3, a lighting assembly 10 according to present invention will be described. The lighting assembly 10 comprises a thermally conductive mounting 12 having a mounting surface 13 and a plurality of light emitting diode (LED) modules 11 mounted along its major axis (X). Each LED module 11 comprises a heat sink seat 14 including a front surface 33 and rear surface 34, LED subunit 16 including an LED 18, and collimator 20. The thermally conductive mounting 12 is elongate and defines indexing channels or slots 22 for mounting the LED modules 11.

The mounting 12 may be constructed of aluminum or other suitable thermally conductive material such as copper or steel. The length of the mounting 12 may be varied to accommodate as many LED modules 11 as are desired for a particular lighting application. Typically, the indexing channels 22 are spaced such that the LED modules 11 are close together in groups or arrays. In other embodiments, the indexing channels 22 are spaced apart to provide a desired distance between the LED modules 11. In another embodiment, only one LED module 11 and indexing channel 22 are provided. In the present embodiment, the mounting surface 13 is a concave surface with the mounting 12 forming a trough. The rear surface 34 is a convex surface. The radius of the mounting surface 13 corresponds with the radius of the convex surface of the heat sink seat 14 to provide a thermal circuit of sufficient surface area to adequately dissipate the heat generated from the operation of the LEDs 18. The radius of the mounting surface 13 should be equal to or greater than the length of an LED module 11. Different shapes for the rear surface 34 and the mounting surface 13 may be used provided the surfaces match and form a contact area sufficient for an effective thermal circuit when the LED modules 11 are mounted. Typically, a thermally conductive surface wetting component such as thermal grease or a thermally conductive fixative such as thermal epoxy or thermal tape is used to improve surface contact between the rear surface 34 and the mounting surface 13. If movement of the LED modules 11 is to be provided in the assembled fixture a surface wetting component should be used. If movement of the LED modules 11 is not desired, a thermally conductive fixative may be used.

Figure 4:
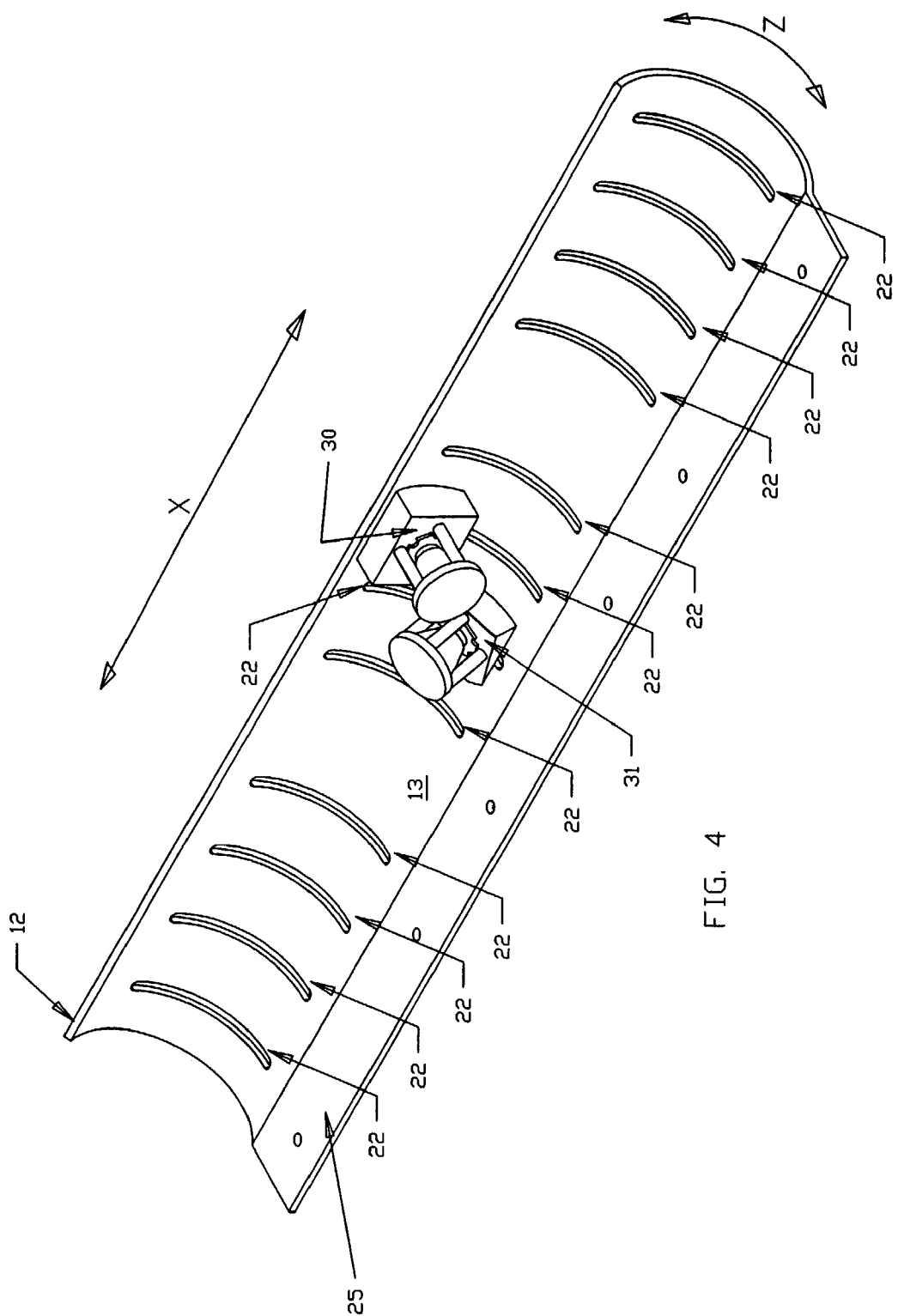
FIG. 4 is a perspective view of the lighting assembly of FIG. 1 showing a flat and a wedge shaped LED module in isolation.
Figure 8:
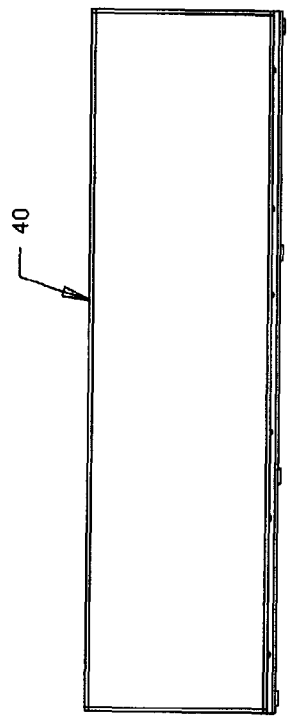
FIG. 8 is a top view of the housing of FIG. 5.
Figure 7:
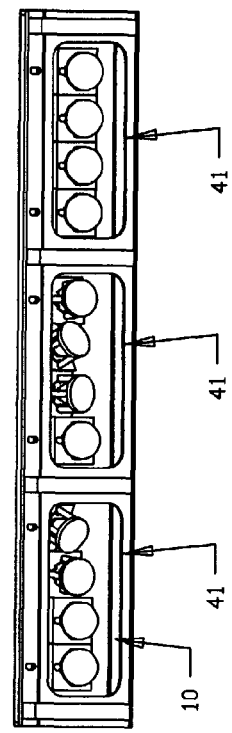
FIG. 7 is a front view of the housing of FIG. 5.
Figure 5:
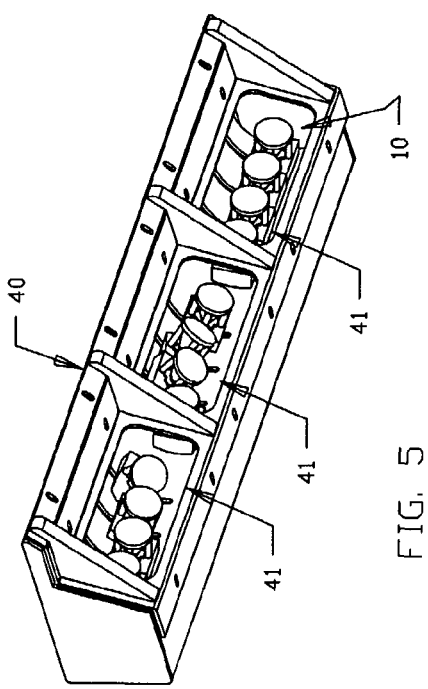
FIG. 5 is a perspective view of a housing containing the lighting assembly of FIG. 1.
Figure 6:
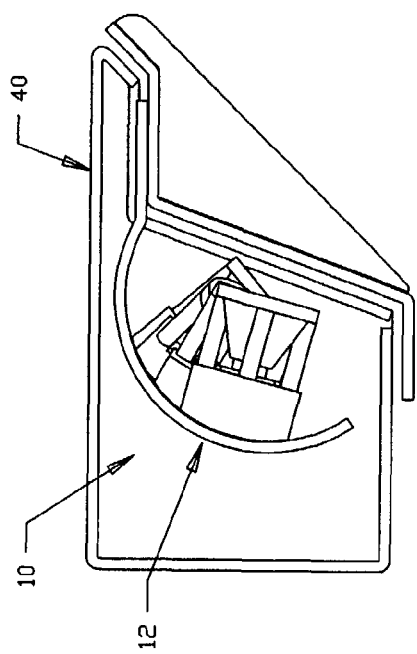
FIG. 6 is a side view of the housing of FIG. 5.

The heat sink seats 14 may be constructed of aluminum or other suitable thermally conductive material such as copper or steel. The front surface 33 of the heat sink seats 14 may be flat 30 or angled 31 (FIG. 4) forming what is referred to as either a flat heat sink seat or an angle heat sink seat respectively. When mounted, the flat front surface 30 is substantially parallel to the major axis (X) of the mounting 12. In contrast, the angled front surface 31 is positioned at an angle to the major axis (X) of the mounting 12 when the heat sink seat 14 is mounted. Other shapes for the heat sink seats 14 are also possible. The heat sink seats 14 may be machined, cut, extruded, or otherwise formed. In one embodiment, the heat sink seats 14 are formed of extruded aluminum and have a flat front surface 30. If an angled front surface 31 is desired for some or all of the heat sink seats 14, the angled front surface 31 is subsequently machined from an extruded flat heat sink seat.

Figure 9:
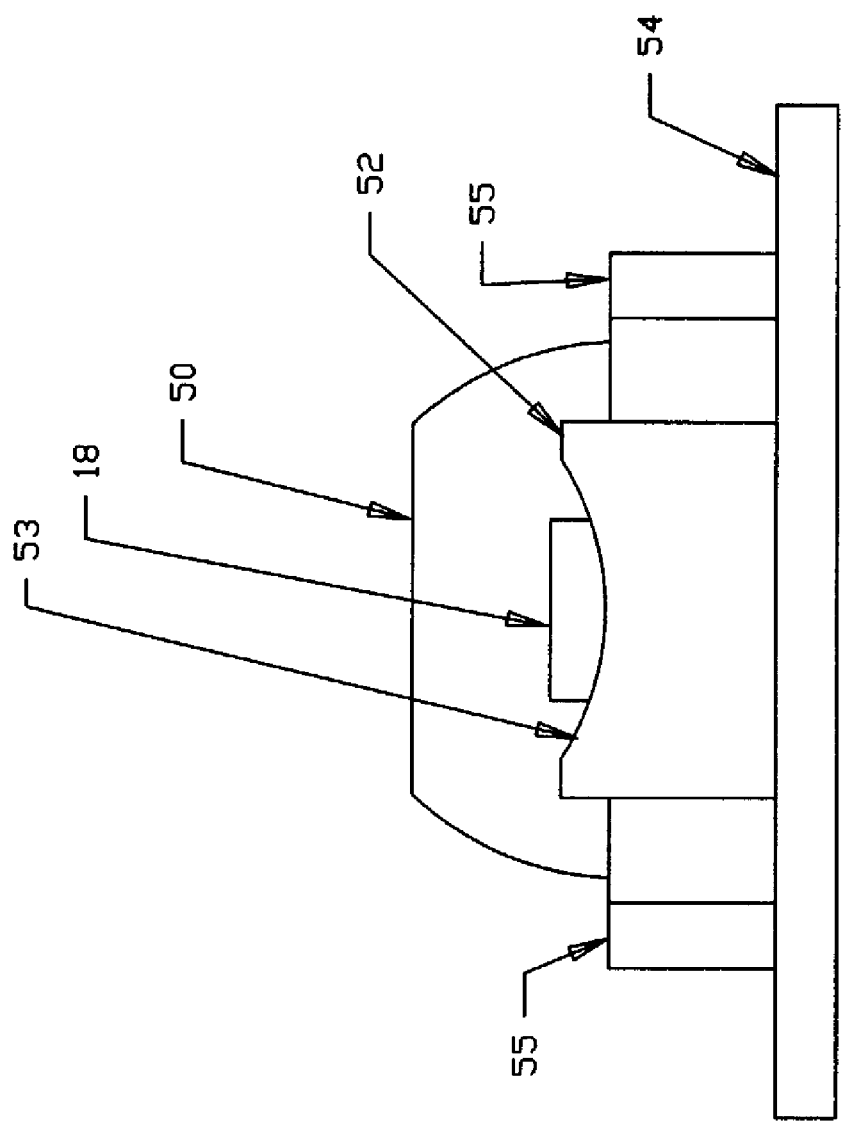
FIG. 9 is a side view of an LED subunit for the lighting assembly of FIG. 1.

Referring now to FIG. 9, an LED subunit 16 will be described in more detail. The LED subunit 16 comprises the LED 18, lens 50, a heat sink slug 52, and a thermally conductive substrate 54. Thermal epoxy or similar fixative is used to attach the LED 18 to the heat sink slug 52 and the heat sink slug 52 to the substrate 54. The heat sink slug 52 is constructed of a thermally conductive material such as aluminum and may include an optical reflector cup 53 which may be attached to or integrally formed with the heat sink slug 50. The reflector cup 53 may be made of thermally conductive materials such as aluminum that have been plated for reflectivity. The substrate 54 provides a large surface area for heat transfer in a thermal circuit. In some embodiments, the substrate 54 is part of a metal-core printed circuit board. In such cases, the circuit board includes electrical connections for the LED 18. In some embodiments, the LED subunits 16 are Luxeon™ LED light sources such as a Luxeon™ Star LED from Lumileds Lighting, LLC (San Jose, Calif., USA). Insulation 55 may be provided to shield the LED 18 and the heat sink slug 52.

Each heat sink seat 14 includes an indexer 24 (FIG. 3) on its rear surface 34. The indexer 24 may be attached to or formed integrally with the heat sink seat 14. The indexer 24 of each heat sink seat 14 is received in a corresponding indexing channel 22 in the mounting 12. The indexer 24 is used to position and secure the corresponding LED module 11 to the mounting 12. The indexer 24 may be a threaded member adapted for receiving a nut. In some embodiments, the indexer 24 is a screw which is threaded into the rear surface 34 of the heat sink seat 14. Other methods of fixing the indexer 24 in the corresponding indexing channel 22 may also be used, for example, friction fits and cammed levers. Using the indexer 24, an LED module 11 may be slid through a range of mounting positions provided by the indexing channels 22 until the desired mounting position for the LED module 11 is obtained. The indexing path (Z) is limited by the upper and lower ends of the indexing channels 22 which define upper and lower limit positions for the LED modules 11 respectively. In this manner, indexing of the LED modules 11 allows the lighting assembly 10 to be customized to the lighting environment and conditions of a particular lighting task. Using the indexing mechanism, LED modules 11 may be individually aimed as required to accomplish the lighting task. Various forms of indicia may be used to mark mounting positions or angles for the indexing channels 22 for ease of assembly. The indexing mechanism can also be used with non-LED light sources to aim or target individual light sources.

In other embodiments, the LED modules 11 are mounted using a suitable thermally conductive adhesive rather than using indexers and channels. In such cases, the LED modules 11 are mounted directly to the mounting 12 to create an effective thermal circuit. Different shapes for the mounting 12 may be used, and the indexing mechanism described above may be substituted for an alternative mechanical fastening means so long as such modifications provide an effective thermal circuit for dissipating heat generated by the LEDs 18.

Many different types of LEDs are known in the art. In some embodiments, the LED 18 is formed of a light-emitting diode die. Power consumption and colour of the light emitted are two considerations affecting the selection of an appropriate LED for a particular lighting application. In some embodiments, a 1 to 5 W LED is used. In other embodiments, a 1 to 3 W LED is used. In yet other embodiments, a 3 W LED is used.

Typically, the light emitted from the LED 18 is focused to narrow its beam width. A collimator 20 having a lens 21 is attached to the heat sink slug to focus the light emitted therefrom. The collimator 20 is attached so that the lens 21 is close to and positioned over the LED 18. For some utility lighting applications, the light beam emitted from the LED 18 is focused to create a beam width of approximately 9 degrees. Examples of a collimator that may be used with the present invention are described in U.S. Pat. No. 6,547,423, issued Apr. 15, 2003. Many different types of collimators are known in the art. The collimator selected affects the properties of the light beam that is obtained. The LED 18 and collimator 20 should be properly selected to obtain the desired lighting characteristics for a particular lighting task.

Referring now to FIG. 5 to 8, a housing 40 for the lighting assembly 10 will be described. The housing 40 defines a plurality of apertures 41 which may be protected by a transparent cover (not shown). The housing 40 is made of a thermally conductive material such as steel or aluminum. A mounting portion 25 of the mounting 12 defines a number of holes which may be used to secure the lighting assembly 10 within the housing 40 using screws or other suitable fasteners. The mounting portion 25 thermally connects the mounting 12 and the housing 40 allowing the housing 40 to dissipate heat from the mounting 12 by conduction. Convection with outside air draws heat away from the housing 40.

Typically, the LED modules 11 are aimed through the apertures 41 at an area or object to be illuminated. Using the indexing mechanism described above, LED modules 11 may be individually aimed to direct the light emitted therefrom through a narrow aperture 41 or lens. The provision of a narrow aperture 41 reduces the overall required size of a lighting fixture, allowing smaller lighting fixtures with blocking light. The aperture may be made narrow without interfering with light emission and while allowing a great range of light aiming due to the concave configuration of mounting 12. Additional aiming of the LED modules 11 may be provided by using an angled heat sink seat rather than a flat heat sink seat. The housing 40 and protective cover (not shown) may be used to protect the lighting assembly 10 from rain, snow, dust, and other environmental elements when used for exterior lighting applications. The housing 40 and protective cover also protect against unwanted access, for example, for the safety of bystanders and to minimize or prevent tampering with the lighting assembly 10.

Figure 10:
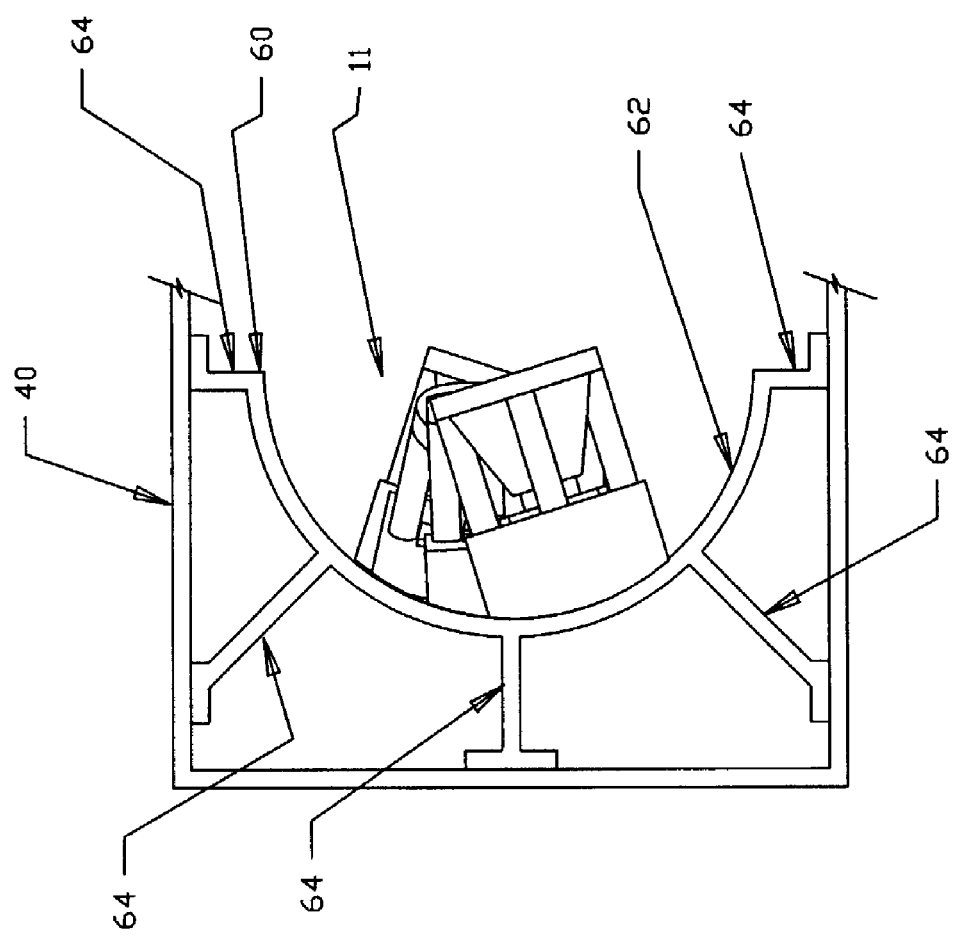
FIG. 10 is a side view of a second embodiment of a mounting for a lighting assembly according to the present invention.

Referring now to FIG. 10, a second embodiment of a mounting 60 for a lighting assembly will be described. The mounting 60 includes a mounting surface 62 similar to the mounting surface 13. The mounting 60 is similar to the mounting 12 in several respects, however the mounting 60 includes a plurality of longitudinally extending fins 64 on its rearward side. The fins 64 may be attached to the housing 40 to secure the mounting 60 using screws, rivets, or other suitable fasteners. The fins 64 increase the surface area of contact between the mounting 60 and the housing 40, increasing heat transfer and providing a more effective thermal circuit. The mounting 60 is preferable for higher power applications such as high wattage LEDs and/or multiple LED devices.

Figure 11:
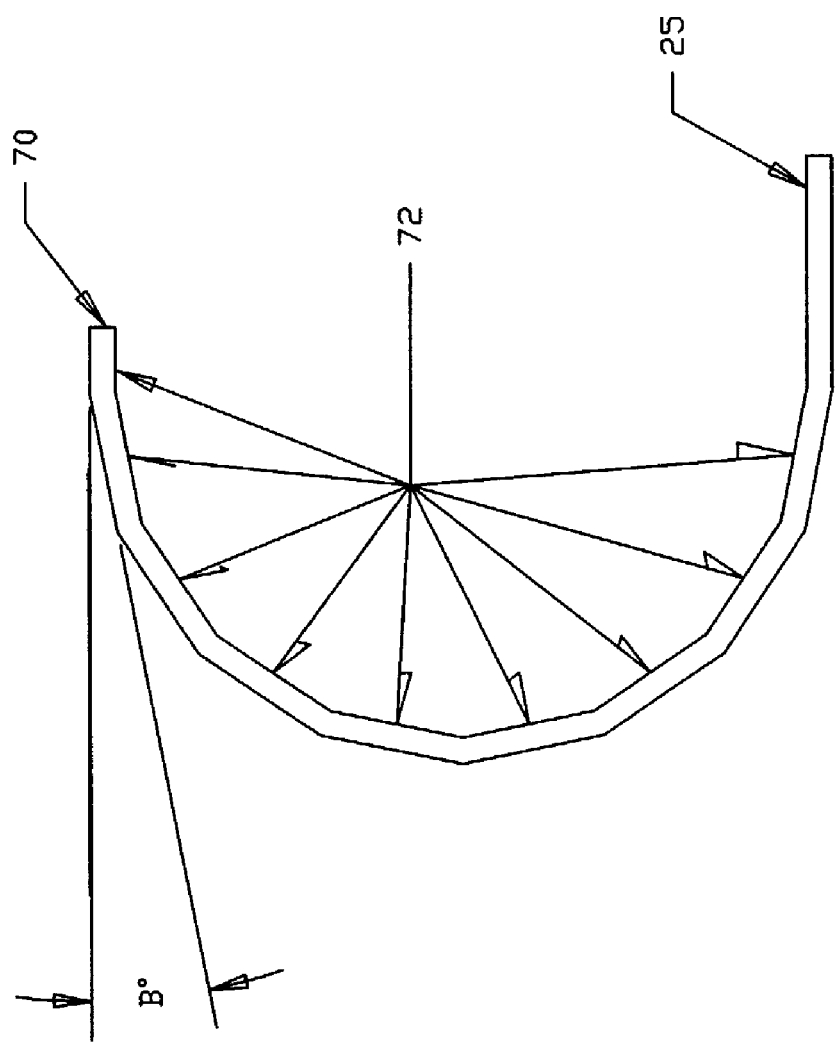
FIG. 11 is a side view of a third embodiment of a mounting for a lighting assembly according to the present invention.

Referring to FIG. 11, a third embodiment of a mounting 70 for a lighting assembly will be described. The mounting 70 comprises a plurality of facetted members or facets 72. The facets 72 are thin, longitudinally extending members formed of a thermally conductive material such as aluminum or carbon steel. The facets 72 may be separate members attached in series using a thermally conductive adhesive or other suitable fastening means, or the facets 72 may be formed integral with one another, for example by using a hydraulic brake to shape a piece of base material. The facets 72 meet at a desired mating angle (B°). The mating angle between the facets 72 is selected to provide the desired range of indexing positions for mounting the LED modules 11. In one embodiment, a mating angle of 15° is used. As in previous embodiments, the rear surface 34 of the heat sink seats 14 must correspond in shape to the shape of the facets 72.

Generally, light emitted from the lighting assembly 10 is directed laterally towards an object or area to be illuminated. Depending on the aiming of the LED modules 11, the light beam may also be directed laterally and downwardly, or laterally and upwardly towards the object or area to be illuminated.

The lighting assembly of the present invention has many applications, including low mounted utility lighting. The lighting assembly 10 may be installed at levels much lower than that of typical light standards, for example, below a handrail for lighting an adjacent walkway or street. Other applications include the installation of the lighting assembly 10 in a ceiling recess to illuminate an area or object while hiding the fixture from plain view. The coupling of the LED 18 to a heat sink seat 14 and thermally conductive mounting 12 creates a thermal circuit for the LEDs 18 which maintains an LED junction temperature that is lower than is otherwise possible, improving reliability and performance of the LEDs 18 because the LEDs 18 are not subject to high thermal stress. Much of the heat generated by the LED 18 is ultimately transferred to the housing 40 where convection with outside air dissipates the heat.

Advantages of the lighting assembly of the present invention include the assembly is linear, modular, easy to manufacture, may be used in tight spaces, and provides flexibility in design. The lighting assembly provides a linear array of LEDs which are modular and may be added or removed, and individually aimed as desired. The assembly is also modular in that two or more lighting assemblies may be used for a particular lighting task and arranged as desired. The lighting assembly also provides many targetable (directional) lights which may be used in tight spaces where clearance around the light is limited.

Several variations of the lighting assembly of the present invention are possible. Minimal heat dissipation occurs from the mounting 12 by convection. If desired, appropriate openings may be defined in the housing 40 to allow air flow through the housing 40. In such cases, air flow may be increased using a fan to increase convection and heat dissipation from the mounting 12. In some embodiments other lights such as incandescent lights may be used with the invention. In some embodiments, two or more LED modules may be mounted within the same indexing channel. In other embodiments, the heat sink seats also include cooling fins. The cooling fins may be attached to or formed integrally with the heat sink seats. In yet other embodiments, two or more LEDs (same or different) may be coupled to one heat sink seat. In such cases, a collimator is used for each LED. The collimators for each may be separate components or formed integrally with one another. Although the use of the lighting assembly has been described with reference to a horizontal orientation, it is also possible for the lighting assembly to be used vertically.

The lighting assemblies of the present invention have many applications, including exterior and utility lighting applications. In some embodiments, lighting assemblies of the present invention may be used for lighting applications in hazardous or flammable environments in so called explosion proof applications. Explosion proof applications are tightly regulated in many jurisdictions. The sealed environment and low external heat production provided by some embodiments of the lighting assembly of the present invention may be advantageous in such some explosion proof applications.

Figure 12:
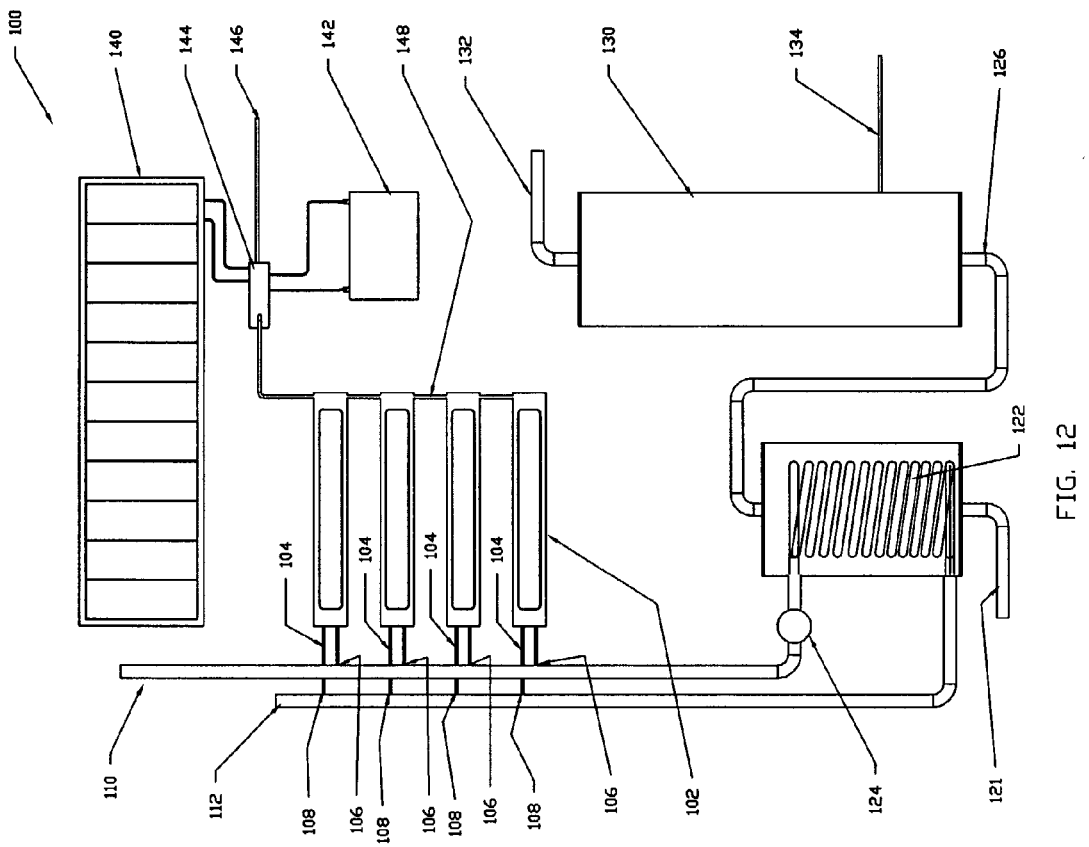
FIG. 12 is schematic diagram of one embodiment of a heat recovery system for lighting assembly according to the present invention.

Referring now to FIGS. 12 and 1, an example of a heat recovery system 100 for a lighting assembly according to the present invention will be described. The heat recovery system 100 comprises one or more lighting assemblies 102 generally similar to the lighting assemblies described above. The lighting assemblies 102 each include a plurality of light emitting diode (LED) modules mounted along its major axis. Each LED module 11 comprises a heat sink seat 14 including a front surface 33 and rear surface 34, LED subunit 16 including an LED 18, and collimator 20. The thermally conductive mounting 12 is elongate and defines indexing channels or slots 22 for mounting the LED modules 11. Other features of the lighting assemblies 102 through not described will be apparent having regard to the lighting assemblies described above. The rear of the lighting assemblies 102 may be enclosed in a housing to facilitate the capture of heat from the LED modules by the heat transfer system. The lighting assemblies 102 are thermally coupled to a heat exchanger tube 104 having an inlet end 106 and an outlet end 108. In one embodiment, the inlet end 106 is connected to a cold water tube 110 carrying water at a relatively low temperature to be heated by the lighting assemblies 102. The outlet end 108 is connected to a hot water tube 112 carrying heated water at a relatively high temperature from the lighting assemblies 102.

The hot water tube 112 is connected to a preheat tank 120. Water from a water source 121, e.g. city water supply, is introduced in the preheat tank 120 for heating. Heated water at a relatively high temperature from the hot water tube 112 passes through a heat exchanger 122 in the preheat tank 120. The preheat tank 120 which utilizes the heat from the heated water to heat water within the preheat tank 120. Cooled water at a relatively low temperature leaves the heat exchanger 122 and is then sent back to the lighting assemblies 102 forming a closed heat recovery cycle. A recirculating pump 124 is used to pump the cold water from the heat exchanger 122 through the cold water tube 110 to lighting assemblies 102. Although not shown, the heat recovery system 100 may also include a thermostat operatively connected so that the system 100 only engages when the lighting assemblies 102 are operational and the temperature of the mounting 150 has reached a pre-selected temperature. For example, the recirculating pump 124 may be operatively connected to the thermostat so that it only activates when the mounting has reached the pre-selected temperature. This configuration allows the lighting assembly to form a sufficient heat differential relative to its environment before the heat recovery system is engaged. Different control systems may be used in different embodiments of the heat recovery system. The thermostat may be of a design modified from those found in automobile coolant systems. The use of a thermostat further increases energy savings due to the fact that no pumping or circulation needs to occur below a pre-selected temperature, for example 21C.

Heated water from the preheat tank 120 is then sent via pipe 126 to a hot water heating tank 130. The heating tank 130 heats the preheated water to a desired temperature. An outlet pipe 132 supplies hot water at the desired temperature. The heating tank 130 may be heated using electricity, natural gas, or other suitable means. In the shown embodiment, the heating tank 130 is heated electrically and is connected to an AC power source 134.

In one embodiment, a solar cell array or photovoltaic array 140 is also provided. The photovoltaic array 140 comprises a plurality of solar cells which are connected electrically. The photovoltaic array 140 receives solar energy during daylight hours to charge a battery 142. The battery 142 holds its charge for use, for example, by the lighting assemblies 102, for example after daylight hours when exterior lighting is required. In the shown embodiment, the photovoltaic array 140 comprises two solar panels each comprising a plurality of solar cells. In other embodiments, a different number or configuration of solar cells may be used. A battery charge controller and AC/DC converter 144 connects the photovoltaic array 140 to the battery 142. An AC power source 146 is also operatively connected to the battery charge controller and AC/DC converter 144. The battery charge controller and AC/DC converter 144 controls the charging of the battery 142, and converts the DC power of the battery to an AC power source 148 for use by the lighting assemblies 102. The battery charge controller and AC/DC converter 144 142 may also be configured to supply the lighting assemblies with AC power directly from the AC power source 146, for example, when the battery charge is insufficient. In some embodiments, the battery charge controller and AC/DC converter 144 may be configured to supply the lighting assemblies 102 with power directly from the solar cells, for example, when supplementary lighting is required during daylight hours. The photovoltaic array 140 is an optional feature, and in some embodiments, the photovoltaic array 140 may be replaced with, for example, a direct AC power source for the lighting assemblies 102.

Figure 13:
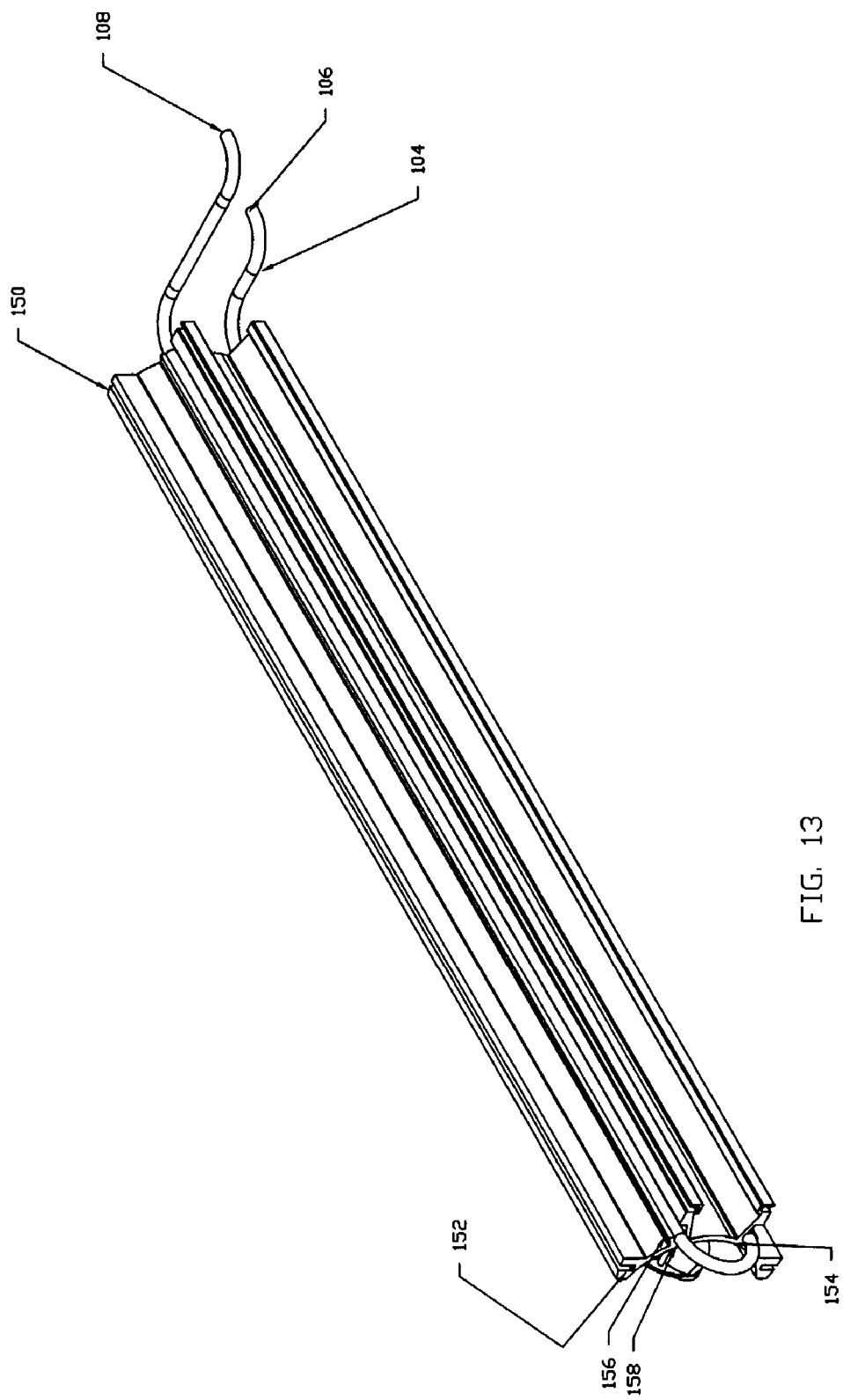
FIG. 13 is perspective view of another embodiment of a lighting assembly according to the present invention.
Figure 14:
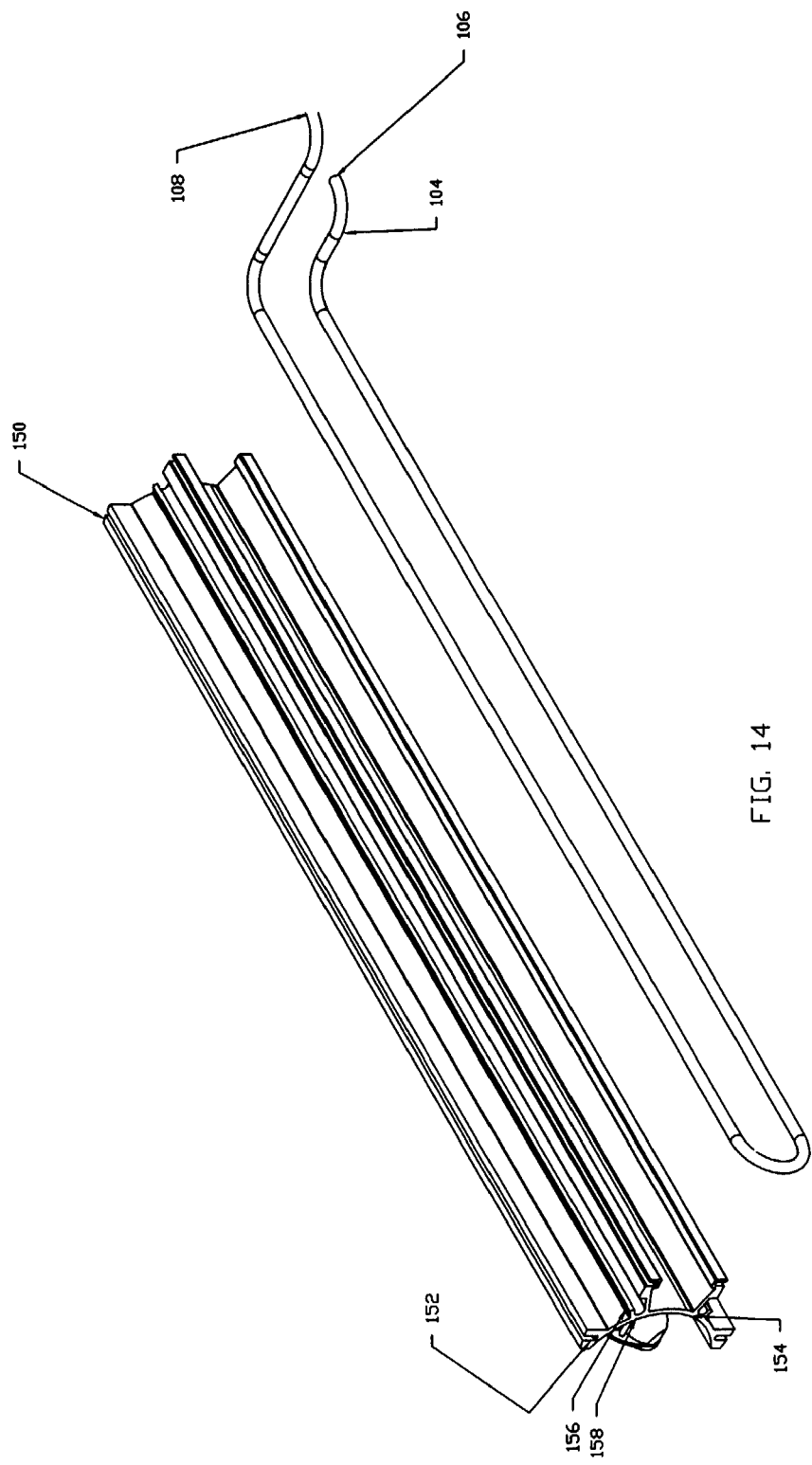
FIG. 14 is an exploded view of the lighting assembly of FIG. 13 with the heat exchanger tubes removed.
Figure 15:
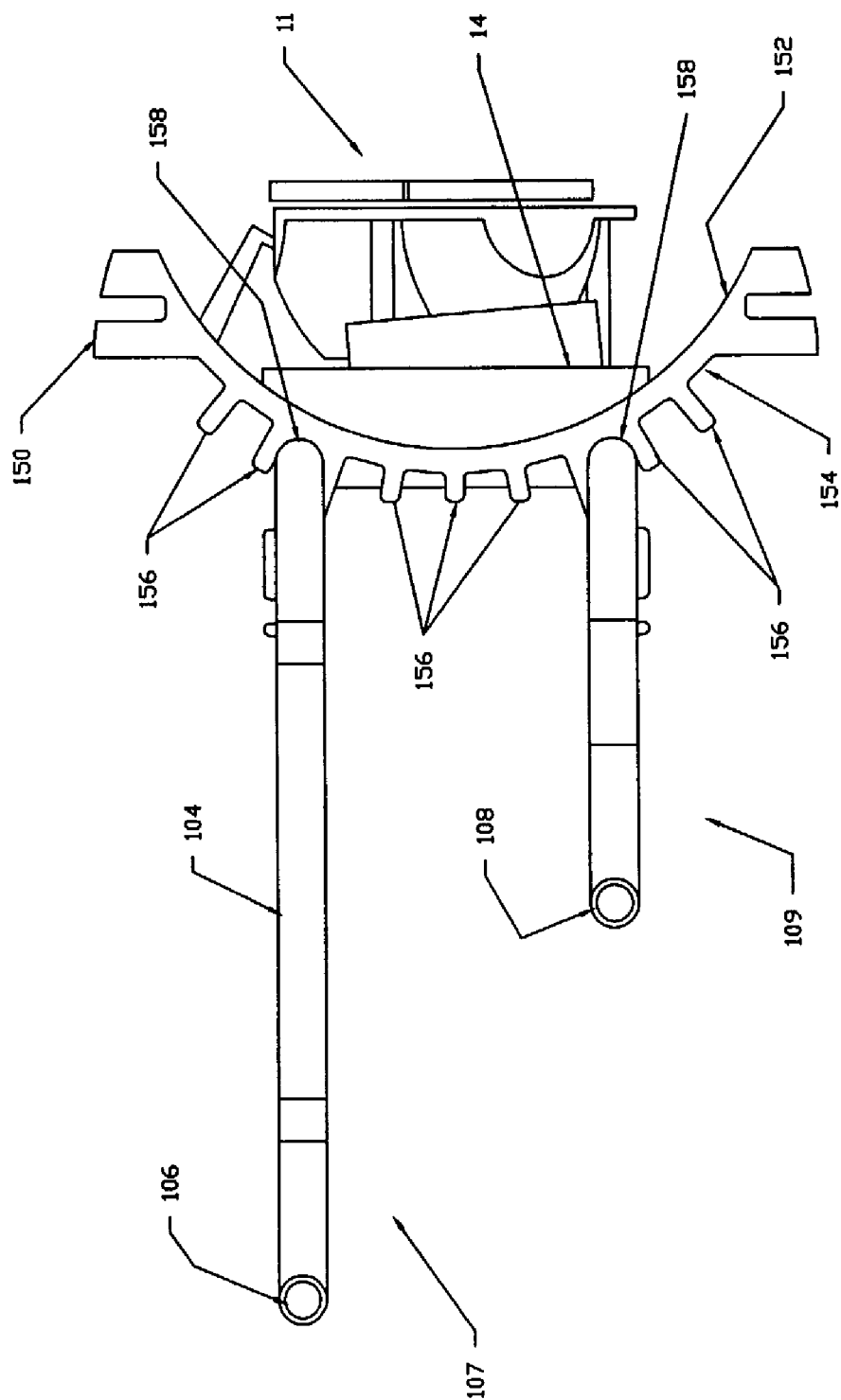
FIG. 15 is an end view of the lighting assembly of FIG. 13.

Referring now to FIG. 13 to 15, a lighting assembly 102 will be described in more detail. The light assembly 102 comprises a thermally conductive mounting 150 having a front surface 152 and rear surface 154. In the shown embodiment, the mounting 150 also includes a plurality of fins 156 extending longitudinally of and outwardly from the rear surface 154 of the mounting 150. A plurality of spaced apart channels or grooves 158 are defined between the fins 156. The channels 158 increase the surface contact between the heat exchanger tube 104 and the mounting 150, thereby increasing the heat transfer between them. In some embodiments, the mounting 150 is constructed of aluminum, however it may be constructed from another suitable thermally conductive material such as copper or steel. In embodiments where the arch or curvature of the mounting 150 defines a circle, the fins 156 are radially extending. A heat exchanger tube 104 for carrying a heat exchange fluid, for example water, is attached to the rear surface 154 of the mounting 150. In some embodiments, the heat exchanger tube 104 is made from copper, however other suitable thermally conductive material may be used, if desired. The heat exchanger tube 104 includes an inlet end 106 for receiving the heat exchange fluid at a relatively low temperature and an outlet end 108 for discharging the heat exchange fluid at a relatively high temperature. In the shown embodiment, the heat exchanger tube 104 is a generally U-shaped tube extending longitudinally of the mounting 150 with the inlet and outlet ends 106, 108 of the heat exchanger tube 104 being disposed towards a common end of the mounting 150. The U-shape of the heat exchanger tube 104 provides a 2-pass heat exchanger having an upper run 107 and a lower run 109. In this embodiment, each run of the U-shaped heat exchanger tube 104 is equally spaced from a center of the mounting 150. The upper and lower runs 107, 109 of the U-shaped heat exchanger tube 104 are received in two of the channels 158. The heat exchanger tube 104 may be attached to the mounting 150 using welding, brazing, thermal adhesive or other suitable method known in the art. In some embodiments, the heat exchanger tubes are mechanically fastened to the mounting 150. In other embodiments, the direction of fluid flow of the heat exchange fluid may be reversed from that shown in FIGS. 13 to 15 i.e. the inlet end 106 may be located where the outlet end 108 is located in the shown embodiment and vice versa. Although a U-shaped heat exchanger tube 104 has been shown, in other embodiments different shapes and configurations of the heat exchanger tube 104 may be used to change the heat exchange profile of the tube 104. For example, in some embodiments a single run heat exchanger tube such as a straight heat exchanger tube may be used.

In the shown embodiment, relatively low temperature heat exchange fluid enters the inlet end 106 of the heat exchanger tube 104. When the lighting assembly is activated, the mounting 150 acts as an ultimate thermal sink for the heat generated by the LEDs 18 of the LED modules 11. As discussed in more detail above, heat generated by the LEDs is transferred to the heat sink seats 14 and to the mounting 150 causing the temperature of the mounting 150 to increase. As the heat exchange fluid, e.g. water, at a relatively low temperature passes through the upper run 107 of the heat exchanger tube 104, heat is transferred from the mounting 150 to the heat exchange fluid increasing its temperature. The heat exchange fluid then passes through the lower run 109 of the heat exchanger tube 104 where more heat is transferred from the mounting 150 to the heat exchange fluid further increasing its temperature. The heat exchange fluid is then discharged via the outlet end 108 at a relatively high temperature. The inlet and outlet ends 106 and 108 of the heat exchanger tube 104 may be connected to cold and hot water tubes 110 and 112 for transporting the relatively low and high temperature water respectively. In some applications, the heat exchanger tube 104 may be connected to a larger thermal application such as the heat recovery system 100 described above. As would be understood by persons skilled in the art, the heat recovery system of the present invention is not limited to water heating applications. Other applications for the recovered heat of the heat recovery system of the present invention will be readily apparent to those skilled in the art. For example, the heat differential provided by the lighting assembly relative to the ambient temperature of its environment may be used to drive a heat engine to do work which, in some applications, may be used to generate electricity where the heat differential is sufficient.

In other embodiments, a plurality of heat exchanger tubes 104 are attached to the rear surface 154 of the mounting 150. In such cases, the upper and lower runs of the U-shaped heat exchanger tube 104 may be replaced with an upper bank and lower bank of heat exchanger tubes having an inlet end at one end of the lighting assembly and an outlet end at the opposite end of the lighting assembly. The mounting 150 may also be configured to receive a plurality of U-shaped heat exchanger tubes or heat exchanger tubes of other configurations. In some embodiments, rather than using one or more heat exchanger tubes 104 which are attached to the rear surface 154 of the mounting 150, the mounting may be extruded, for example from aluminum, and may define a plurality of heat exchanger channels or conduits for receiving a heat exchanger fluid. The extruded mounting may be a one-piece extrusion or a multi-piece extrusion which combines to define the heat exchanger channels.

Figure 16:
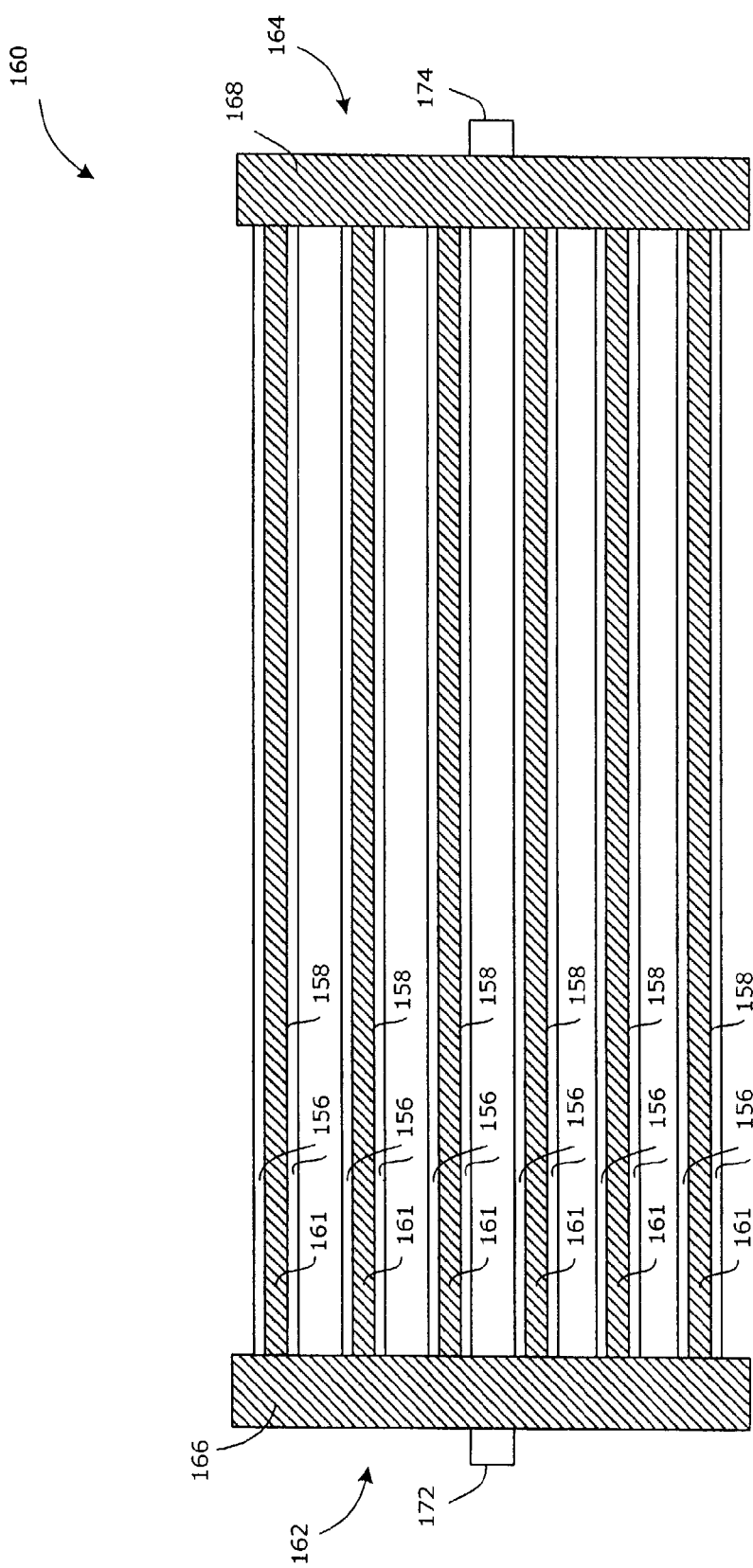
FIG. 16 is an exploded rear view of another embodiment of a lighting assembly according to the present invention showing upper and lower heat exchanger tube banks.

FIG. 16 shows one embodiment of a lighting assembly 160 according to the present invention in which a plurality of heat exchanger tubes 161 are provided on the rear surface 154 of the mounting. The heat exchanger tubes 161 have an inlet end 162 at one end of the lighting assembly 160 and an outlet end 164 at the opposite end of the lighting assembly 160. An inlet chamber 166 is provided at the inlet end 162, and an outlet chamber 168 is provided at the outlet end 164. Inlet and outlet fittings (connectors) 172 and 174 are attached to openings (not shown) in fluid communication with the inlet and outlet chambers 166, 168. In some embodiments, for example when the lighting assembly 160 is received in a generally cylindrical housing, the inlet and outlet chamber 166, 168 may be generally cylindrical in shape.

The heat exchanger tubes 161 are in fluid communication with and extend between the inlet chamber 166 and outlet chamber 168. The inlet fitting 172 may be connected to a cold water tube 110 carrying water at a relatively low temperature to be heated by the lighting assembly 160, and the outlet fitting 174 may be connected to a hot water tube 112 carrying heated water at a relatively high temperature which has been heated by the lighting assembly 160. In operation, water to be heated is introduced into the inlet chamber 166 though the fitting 172. The water then passes through the applications the heat exchanger tubes 161 where heat from the mounting 150 is transferred to the water. The heated water then exits the heat exchanger tubes 161 and enters the outlet chamber 168. The heated water is then discharge via the outlet fitting 174.

In the shown embodiment, the heat exchanger tubes 161 are straight tubes which are received between the fins 156 within respective channels 158 in the mounting 150. In the shown embodiment, the heat exchanger tubes 161 form an upper heat exchanger tube bank and a lower heat exchanger tube bank. In some embodiments, heat exchanger tubes 161 and inlet and outlet chambers 166, 168 are made from copper, however other suitable thermally conductive material may be used. The heat exchanger tubes 161 may be attached to the mounting 150 using welding, brazing, thermal adhesive or other suitable method known in the art. In some embodiments, the heat exchanger tubes are mechanically fastened to the mounting 150. In some embodiments, a thermal grease is used to increase the surface contact between the heat exchanger tubes 161 and the mounting 150.

According to one aspect of the present invention, there is provided a heat recovery system, comprising: a lighting assembly including a thermally conductive mounting having a rear surface, and a heat exchanger tube provided on to the rear surface of the mounting for carrying a heat exchange fluid, the heat exchanger tube having an inlet end for receiving the heat exchange fluid at a relatively low temperature and an outlet end for discharging the heat exchange fluid at a relatively high temperature.

In other applications, for example when the ambient temperature of the environment is relatively high, for example 30 to 40° C., the lighting assembly may be used for cooling of the mounting rather than heat recovery. In such applications, the ambient temperature makes it difficult for the LED modules 11 to be operated at optimal operating temperatures. In such cases, the heat exchanger tubes may be used, for example in conjunction with a cooling system, to lower the temperature of the LED modules 11 to a desired operating temperature, for example 20° C.

Although the heat recovery system of the present invention has been described as using water as the heat exchange liquid, it will be appreciated by persons skilled in the art that other suitable heat exchange fluids may could also be used. For example, the heat recovery system could be configured to use air or other suitable gas in some applications. Further, the heat recovery system of the present invention is not limited to the light assembly 102 described above.

Persons skilled in the art would appreciate that other lighting assemblies such as those previously described could also be adapted for use in the heat recovery system, and that various modifications and alternations of the lighting assemblies previously described may be effected for use in the heat recovery system.

Although the present invention has been described with reference to illustrative embodiments, it is to be understood that the invention is not limited to these precise embodiments, and that various changes and modifications may be effected therein by one skilled in the art. All such changes and modifications are intended to be encompassed in the appended claims.

I claim:

1. A lighting assembly, comprising:
   a thermally conductive mounting having a mounting surface; and
   a heat sink seat having a front surface and a rear surface, said heat sink seat being moveably mounted to said mounting surface, wherein the shape of said mounting surface corresponds to the shape of the rear surface of said heat sink seat, wherein the front of said heat sink seat receives a light emitting device;
   wherein the rear surface of said heat sink seat forms a convex surface and said mounting surface forms a concave surface, and wherein the radius of said convex surface corresponds to the radius of said concave surface; and
   wherein said mounting defines an indexing channel for mounting said heat sink seat, and wherein said heat sink seat further includes an indexer at the rear surface thereof, said indexer being received in said indexing channel.

2. The lighting assembly as claimed in claim 1, wherein said light emitting device is a light emitting diode (LED) thermally coupled to the front surface of said heat sink seat.

3. The lighting assembly as claimed in claim 1, wherein said light emitting device is a LED having an aluminum slug on a rear surface of said LED.

4. The lighting assembly as claimed in claim 1, wherein said mounting and said heat sink seat are formed of aluminum.

5. The lighting assembly as claimed in claim 1, wherein said heat sink seat includes a front portion forming a wedge for angling said light emitting device.

6. The lighting assembly as claimed in claim 1, wherein said mounting defines a plurality of indexing channels corresponding to a plurality of said heat sink seats.

7. The lighting assembly as claimed in claim 1, further comprising a collimator including a lens attached to the front surface of said heat sink seat, wherein said lens is operably positioned over said LED for focusing the light emitted therefrom.

8. The lighting assembly as claimed in claim 1, further comprising: a plurality of LEDs thermally coupled to the front surface of said heat sink seat; a plurality of collimators including a lens attached to the front surface of said heat sink seat, wherein each said lens is operably positioned over one LED in the plurality of LEDs for focusing the light emitted therefrom.

9. The lighting assembly as claimed in claim 7, further compromising a heat sink slug thermally connected to said LED and thermally coupled to the front surface of said heat sink seat.

10. The lighting assembly as claimed in claim 9, further comprising a thermally conductive substrate having a top and bottom surface, wherein the top surface of said substrate is thermally connected to said heat sink slug, and wherein the bottom surface of said substrate is thermally connected to the front, surface of said heat sink seat.

11. The lighting assembly as claimed in claim 10, wherein the surface area of the bottom surface is sufficient to create an effective thermal circuit.

12. The lighting assembly as claimed in claim 7, wherein the radius of said concave surface is equal to or greater than the distance from the rear surface of said heat sink seat to a top surface of the collimator.

13. The lighting assembly as claimed in claim 1, wherein said mounting is a longitudinally extending thermally conductive mounting having a mounting surface and a major axis, and wherein said heat sink seat is moveably mounted along the major axis of said mounting.

14. The lighting assembly as claimed in claim 1, wherein said indexing channels are transverse indexing channels.

15. The lighting assembly as claimed in claim 1, wherein said indexing channel includes an upper and lower limit position defined by the respective ends of said indexing channel, wherein said heat sink seat is moveable between said upper and lower limit positions.

16. The lighting assembly as claimed in claim 1, further comprising a longitudinally extending thermally conductive housing defining an aperture on a first wall thereof, and wherein said mounting includes a mounting portion, and wherein said mounting portion is thermally connected to said housing, and wherein said LED maybe aimed through said aperture at an area or object to be illuminated.

17. The lighting assembly as claimed in claim 1, wherein said mounting further includes a rearward side and a plurality of longitudinally extending fins extending from the rearward side of said mounting.

18. A heat recovery system, comprising:
   a lighting assembly, comprising: a thermally conductive mounting having a mounting surface; and a heat sink seat having a front surface and a rear surface, said heat sink seat being moveably mounted to said mounting surface, wherein the shape of said mounting surface corresponds to the shape of the rear surface of said heat sink seat, wherein the front of said heat sink seat receives a light emitting device; wherein the rear surface of said heat sink seat forms a convex surface and said mounting surface forms a concave surface, and wherein the radius of said convex surface corresponds to the radius of said concave surface; and
   a heat exchanger tube provided on a rear surface of the mounting for carrying a heat exchange fluid, the heat exchanger tube having an inlet end for receiving the heat exchange fluid at a relatively low temperature and an outlet end for discharging the heat exchange fluid at a relatively high temperature;

wherein the mounting further includes a plurality of fins extending radially and outwardly from the rear surface of the mounting.

19. The heat recovery system as claimed in claim 18, wherein the heat exchanger tube is a U-shaped tube extending longitudinally of the mounting with the inlet and outlet end of the heat exchanger tube being disposed towards a common end of the mounting.

20. The heat recovery system as claimed in claim 18, wherein the rear surface of the mounting defines a channel for receiving the heat exchanger tube.

21. A heat recovery system, comprising:
- a thermally conductive mounting having a rear surface and a mounting surface;
- a heat sink seat having a front and rear surface, the heat sink seat being moveably mounted to the mounting surface;
- a light emitting device mounted to the front surface of the heat sink seat;
- and a heat exchanger tube provided on the rear surface of the mounting for carrying a heat exchange fluid, the heat exchanger tube having an inlet end for receiving the heat exchange fluid at a relatively low temperature and an outlet end for discharging the heat exchange fluid at a relatively high temperature;
- wherein the mounting further includes a plurality of fins extending radially and outwardly from the rear surface.

22. The heat recovery system as claimed in claim 21, wherein the heat exchanger tube is a U-shaped tube extending longitudinally of the mounting with the inlet and outlet end of the heat exchanger tube being disposed towards a common end of the mounting.

23. The heat recovery system as claimed in claim 22, wherein the rear surface of the mounting defines a pair of spaced apart channels for receiving the U-shaped heat exchanger tube.

24. The heat recovery system as claimed in claim 21, wherein the fins define a plurality of channels therebetween for receiving the heat exchanger tube.

25. The heat recovery system as claimed in claim 21, further comprising: a plurality of heat exchanger tubes provided on the rear surface of the mounting for carrying a heat exchange fluid, each heat exchanger tube having an inlet end for receiving the heat exchange fluid at a relatively low temperature and an outlet end for discharging the heat exchange fluid at a relatively high temperature; wherein the rear surface of the mounting defines a plurality of channels therebetween for receiving one of the heat exchanger tubes.

26. The heat recovery system as claimed in claim 25, further comprising: an inlet chamber provided at and in fluid communication with the inlet end of the heat exchanger tubes, the inlet chamber defining an opening for receiving heat exchange fluid at a relatively low temperature from a source of heat exchange fluid; and an outlet chamber provided at and in fluid communication with the outlet end of the heat exchanger tubes, the outlet chamber defining an opening for discharging heat exchange fluid at a relatively high temperature.

27. The heat recovery system as claimed in claim 21, wherein the light emitting device is a light emitting diode thermally coupled to the front surface of the heat sink seat.

28. The heat recovery system as claimed in any one of claim 21-23 or 24-27, wherein the shape of the mounting surface corresponds to the shape of the rear surface of the heat sink seat.

* * * * *